US012638531B2

(12) United States Patent
Srinivas et al.

(10) Patent No.: US 12,638,531 B2
(45) Date of Patent: May 26, 2026

(54) SYSTEM AND METHOD FOR RF BASED FREQUENCY ENCODING USING INJECTION TRANSFORMERS FOR SIMULTANEOUS TRANSMIT AND RECEIVE

(71) Applicants: Case Western Reserve University, Cleveland, OH (US); Vanderbilt University, Nashville, TN (US)

(72) Inventors: Sai Abitha Srinivas, Nashville, TN (US); William A. Grissom, Shaker Heights, OH (US); Mark A. Griswold, Shaker Heights, OH (US)

(73) Assignees: Case Western Reserve University, Cleveland, OH (US); Vanderbilt University, Nashville, TN (US)

( * ) Notice: Subject to any disclaimer, the term of this patent is extended or adjusted under 35 U.S.C. 154(b) by 198 days.

(21) Appl. No.: 18/665,093

(22) Filed: May 15, 2024

(65) Prior Publication Data

US 2024/0385268 A1     Nov. 21, 2024

Related U.S. Application Data

(60) Provisional application No. 63/502,296, filed on May 15, 2023.

(51) Int. Cl.
*G01V 3/00* (2006.01)
*G01R 33/3415* (2006.01)
(Continued)

(52) U.S. Cl.
CPC ..... *G01R 33/4831* (2013.01); *G01R 33/3415* (2013.01); *G01R 33/5608* (2013.01); *G01R 33/583* (2013.01)

(58) Field of Classification Search
CPC ............ G01R 33/4831; G01R 33/3415; G01R 33/5608; G01R 33/583
(Continued)

(56) References Cited

U.S. PATENT DOCUMENTS

| | | | |
|---|---|---|---|
| 9,625,551 B2 | 4/2017 | Ozen et al. | |
| 9,995,808 B2 | 6/2018 | Grissom et al. | |

(Continued)

OTHER PUBLICATIONS

Bloch, F., and A. Siegert. "Magnetic resonance for nonrotating fields." Physical Review 57.6 (1940): 522.
(Continued)

*Primary Examiner* — Walter L Lindsay, Jr.
*Assistant Examiner* — Frederick Wenderoth
(74) *Attorney, Agent, or Firm* — Quarles & Brady LLP

(57) ABSTRACT

A system for RF based frequency encoding utilizing a Bloch-Siegert shift, includes a controller, an RF encoding system, and an injection transformer simultaneous transmit and receive filter. The controller generates RF excitation pulses, RF based frequency encoding pulses, and a cancellation signal. The RF encoding system includes one or more RF coils configured to transmit the RF excitation pulses and RF based frequency encoding pulses, and to receive an MR signal from the subject where the MR signal includes a leakage signal induced by the RF based frequency encoding pulses. The injection transformer simultaneous transmit and receive filter is in signal communication with the controller and the RF encoding system. The injection transformer simultaneous transmit receive filter is configured to receive the cancellation signal, the MR signal including the leakage signal, and to cancel the leakage signal from the received MR signal to generate a filtered MR signal.

19 Claims, 7 Drawing Sheets

(51) Int. Cl.
  *G01R 33/483*    (2006.01)
  *G01R 33/56*    (2006.01)
  *G01R 33/58*    (2006.01)

(58) Field of Classification Search
  USPC ........................................................ 324/309
  See application file for complete search history.

(56)          References Cited

U.S. PATENT DOCUMENTS

| | | | |
|---|---|---|---|
| 10,627,463 B2 | 4/2020 | Schillak et al. | |
| 2015/0253403 A1* | 9/2015 | Grissom | G01R 33/4831 |
| | | | 324/309 |
| 2017/0180166 A1* | 6/2017 | Zhou | H04B 1/525 |
| 2024/0385268 A1* | 11/2024 | Srinivas | G01R 33/4831 |

OTHER PUBLICATIONS

Cao, Zhipeng, Eduard Y. Chekmenev, and William A. Grissom. "Frequency encoding by Bloch-Siegert shift." Proc. 22nd Annu. Meet. Int. Soc. Magn. Res. Med 4220 (2014).

Ha, Yonghyun, et al. "Design of frequency division duplex RF system for frequency encoding using Bloch-Siegert shift." Proc. 29th Annu. Meet. Int. Soc. Magn. Res. Med 0749 (2020).

Hasselwander, Christopher J., and William A. Grissom. "Bloch-Siegert phase-encoded MRI with a single RF coil and frequency-swept pulses." Proceedings of the 25th Annual Meeting of ISMRM, Honolulu, HI. 5047 (2017).

Hoult, D. I. "Rotating frame zeugmatography." Journal of Magnetic Resonance (1969) 33.1 (1979): 183-197.

Jankiewicz, Marcin, John C. Gore, and William A. Grissom. "Improved encoding pulses for Bloch-Siegert B1+ mapping." Journal of Magnetic Resonance 226 (2013): 79-87.

Kartäusch, Ralf, et al. "Spatial phase encoding exploiting the Bloch-Siegert shift effect." Magnetic Resonance Materials in Physics, Biology and Medicine 27 (2014): 363-371.

Martin, Jonathan B., et al. "Selective excitation localized by the Bloch-Siegert shift and a B 1+ gradient." Magnetic resonance in medicine 88.3 (2022): 1081-1097.

Metz, Kenneth R., et al. "Rapid rotating-frame imaging using an RF pulse train (RIPT)." Journal of Magnetic Resonance, Series B 103.2 (1994): 152-161.

Ozen, Ali Caglar, and Atalar Ergin. "Active decoupling of RF coils: application to 3D MRI with concurrent excitation and acquisition." Proceedings of International Society for Magnetic Resonance in Medicine. 2015.

Sacolick, Laura I., et al. "B1 mapping by Bloch-Siegert shift." Magnetic resonance in medicine 63.5 (2010): 1315-1322.

Selvaganesan, Kartiga, et al. "Nonlinear projection imaging with the Bloch-Siegert shift in an inhomogeneous B 0 at low-field." Proc. 30th Annu. Meet. Int. Soc. Magn. Res. Med 0899 (2021).

Sharp, Jonathan C., and Scott B. King. "MRI using radiofrequency magnetic field phase gradients." Magnetic Resonance in Medicine: An Official Journal of the International Society for Magnetic Resonance in Medicine 63.1 (2010): 151-161.

Sohn, Sung-Min, et al. "In vivo MR imaging with simultaneous RF transmission and reception." Magnetic resonance in medicine 76.6 (2016): 1932-1938.

Srinivas, Sai Abitha, et al. "EMI-Suppressed Gradient-Free Phase-Encoded Imaging at 47.5 mT Using an Optimized Square-Root Solenoid for Encoding and a Saddle Coil for Imaging." Proc. 31st Annu. Meet. Int. Soc. Magn. Res. Med 00062 (2022).

Srinivas, Sai Abitha. Gradient-Free Low-Field MRI using the Bloch-Siegert Shift for RF Spatial Encoding. Diss. 2023.

Straney, Don, Clarissa Zimmerman Cooley, and Matthew S. Rosen. "An improved power handling active transmit/receive switch for low field MRI using reed relays." Proceedings of the 25th Annual Meeting of ISMRM, London, UK. vol. 1395. 2022.

Torres, Efraín, et al. "B 1-gradient-based MRI using frequency-modulated Rabi-encoded echoes." Magnetic resonance in medicine 87.2 (2022): 674-685.

Trushkin, D. V., O. A. Shushakov, and A. V. Legchenko. "The potential of a noise-reducing antenna for surface NMR groundwater surveys in the earth's magnetic field." Geophysical Prospecting 42.8 (1994): 855-862.

Wilcox, Matthew, et al. "A Linear Gradient Solenoid for Slice-Selective Brain Imaging using B1+-Selective RF Pulses." Proc. 30th Annu. Meet. Int. Soc. Magn. Res. Med 4035 (2021).

* cited by examiner

ACQUIRE MR DATA FROM SUBJECT USING RF BASED FREQUENCY ENCODING WITH BLOCH-SIEGERT SHIFT AND SIMULTANEOUS TRANSMIT AND RECEIVE — 202

GENERATE AT LEAST ONE IMAGE OF THE SUBJECT — 204

DISPLAY THE AT LEAST ONE IMAGE — 206

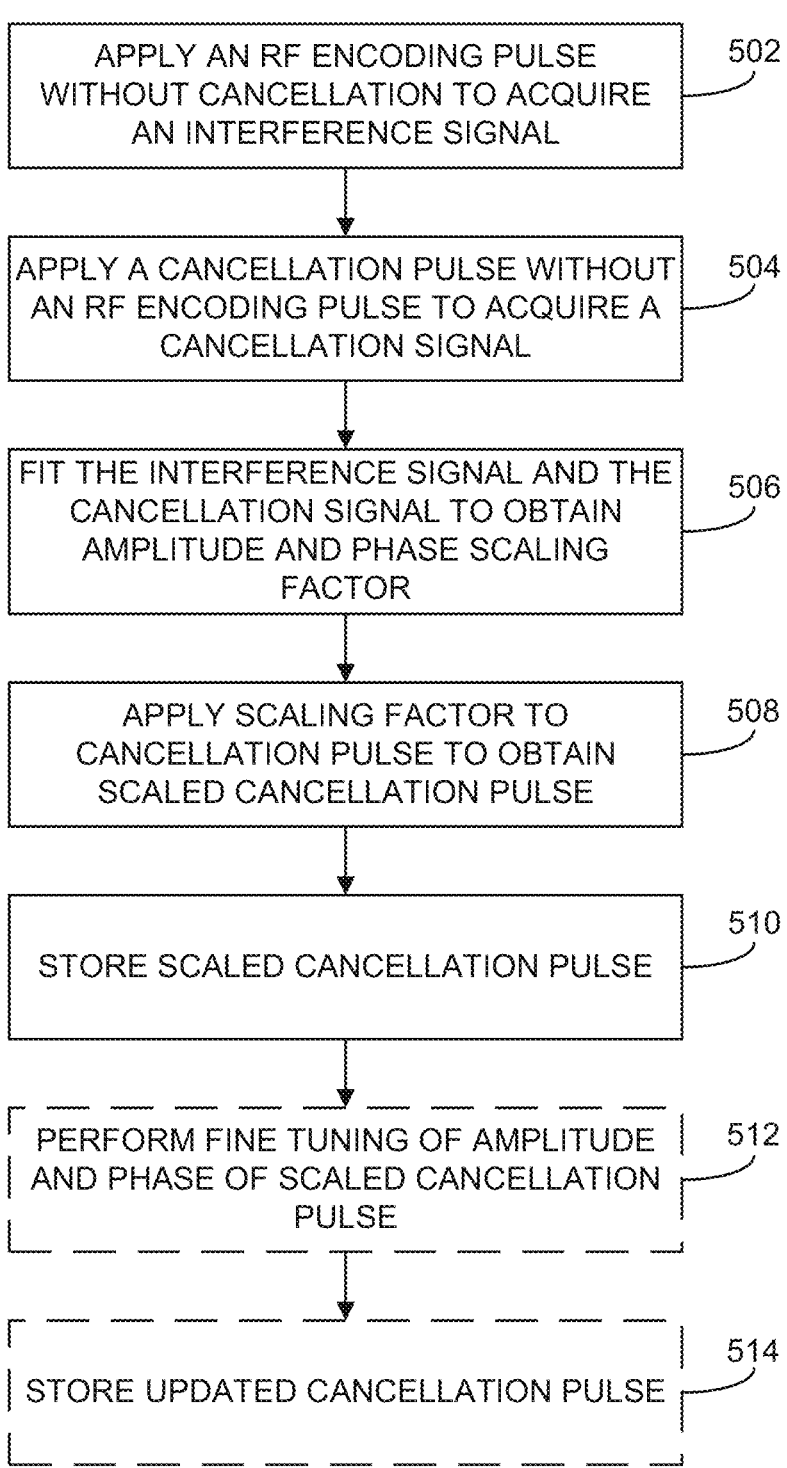

APPLY AN RF ENCODING PULSE WITHOUT CANCELLATION TO ACQUIRE AN INTERFERENCE SIGNAL — 502

APPLY A CANCELLATION PULSE WITHOUT AN RF ENCODING PULSE TO ACQUIRE A CANCELLATION SIGNAL — 504

FIT THE INTERFERENCE SIGNAL AND THE CANCELLATION SIGNAL TO OBTAIN AMPLITUDE AND PHASE SCALING FACTOR — 506

APPLY SCALING FACTOR TO CANCELLATION PULSE TO OBTAIN SCALED CANCELLATION PULSE — 508

STORE SCALED CANCELLATION PULSE — 510

PERFORM FINE TUNING OF AMPLITUDE AND PHASE OF SCALED CANCELLATION PULSE — 512

STORE UPDATED CANCELLATION PULSE — 514

FIG. 6

SYSTEM AND METHOD FOR RF BASED FREQUENCY ENCODING USING INJECTION TRANSFORMERS FOR SIMULTANEOUS TRANSMIT AND RECEIVE

CROSS-REFERENCE TO RELATED APPLICATIONS

This application is based on, claims priority to, and incorporates herein by reference in its entirety U.S. Ser. No. 63/502,296 filed May 15, 2023 and entitled "RF Based Frequency Encoding For Gradient-Less MRI Using Injection Transformers For Simultaneous Transmit and Receive."

STATEMENT REGARDING FEDERALLY SPONSORED RESEARCH

This invention was made with government support under EB 032709 and EB 030414 awarded by the National Institutes of Health. The government has certain rights in the invention.

BACKGROUND

The human body is made up of 70% water and magnetic resonance imaging (MRI) systems image the protons present in this water. Fundamentally, an MRI system HAS three main components: 1) the magnet that aligns all the protons which act as tiny bar magnets, along the pole lines; 2) radiofrequency (RF) coils and power amplifier systems that are used to "excite" these protons at a resonant frequency and then receive signals back from those same protons; and 3) a gradient coil and amplifier system that is used to produce linear field gradients such that these excited protons tilt slightly away from each other to enable spatial localization to form 3D images. These images are represented in "k-space" which is than Fourier transformed to get images which may be displayed and reviewed by, for example, an operator or clinician.

For image encoding, gradients are used in three ways: 1) frequency encoding; 2) phase encoding; and 3) slice-selection. Physically, these gradients can be applied in any direction but produce gradients in different ways. Frequency encoding gradients are applied at the same time as the receiver coil (Rx) is on for acquisition, so that k-space is continually traversed as magnetic resonance (MR) signal is recorded. Phase encoding and slice-selection are applied in an interleaved manner with MR signal readout, and hence encode one position in k-space (phase encoding) or limit the signal to one slice (slice-selection). Because a large number of k-space coordinates are traversed rapidly in frequency encoding, it is the most time-efficient spatial encoding mechanism in MRI. Frequency encoding gradients are typically applied in two parts: 1) pre-phasor; and 2) readout. The pre-phasor is used to rewind the phase from the center of k-space to the negative or positive mode part of k-space. The readout gradient, which is played during acquisition of the MR signal, takes the phase from the most negative/most positive to the other extent of k-space.

A significant cost of MRI arises from the conventional $B_0$ gradient systems used for spatial encoding. Conventional $B_0$ gradient systems can be the weakest point of the MRI system because the gradient systems vibrate due to the currents flowing through the gradient coils causing breakage of the coils and increasing the need for maintenance. These vibrations are also responsible for loud acoustic noises which is one of the biggest causes for patient discomfort especially for pediatric studies. The currents flowing through the gradient coils also induces heating which requires liquid cooling systems to coil the gradient coils. Conventional gradients also use specialty amplifiers which are specifically designed for MR systems unlike RF amplifiers which are a commodity. Additionally, conventional gradient systems are extremely bulky due to the specific designs and material that are required to produce them which can preclude portable MRI systems. Conventional gradients also cause peripheral nerve stimulation (PNS) due to fast switching currents in these direct current (DC) coils. Frequency encoding gradients are especially the most power intensive to run since a frequency encoding gradient is longer than the other gradients in most cases.

Eliminating conventional gradients could help miniaturize and lower costs of MRI significantly. Several spatial encoding methods have been developed that use RF gradients instead of conventional $B_0$ gradients for phase and slice encoding. However, frequency encoding, the fastest Fourier encoding mechanism in MRI, has not yet been achieved using RF gradients.

SUMMARY OF THE DISCLOSURE

In accordance with an embodiment, a system for RF based frequency encoding utilizing a Bloch-Siegert shift, includes a controller, an RF encoding system, and an injection transformer simultaneous transmit and receive filter. The controller is configured to generate RF excitation pulses, RF based frequency encoding pulses, and a cancellation signal. The RF encoding system is in signal communication with the controller and includes one or more RF coils configured to transmit the RF excitation pulses and RF based frequency encoding pulses, and to receive an MR signal from the subject where the MR signal includes a leakage signal induced by the RF based frequency encoding pulses. The injection transformer simultaneous transmit and receive filter is in signal communication with the controller and the RF encoding system. The injection transformer simultaneous transmit receive filter is configured to receive the cancellation signal, the MR signal including the leakage signal, and to cancel the leakage signal from the received MR signal to generate a filtered MR signal.

In accordance with another embodiment, a method for generating an image of a subject using RF based frequency encoding utilizing a Bloch-Siegert shift includes, for each of a plurality of predetermined portions of k-space, performing an imaging module of a RF based frequency encoding pulse sequence to obtain imaging MR data and performing a calibration module of the RF based frequency encoding pulse sequence to obtain calibration MR data. The imaging module includes an RF excitation pulse and one or more RF frequency encoding pulses. The calibration module is performed without the RF excitation pulse and includes the one or more RF frequency encoding pulses. The method further includes determining frequency encoded MR data by subtracting the calibration MR data from the imaging MR data, storing the determined frequency encoded MR data for each predetermined portion of k-space, and generating an image of the subject based on the frequency encoded MR data for the plurality of predetermined portions of k-space.

BRIEF DESCRIPTION OF THE DRAWINGS

The present invention will hereafter be described with reference to the accompanying drawings, wherein like reference numerals denote like elements.

FIG. 6 illustrates a method for calibrating a cancellation signal for RF based frequency encoding in accordance with an embodiment.

DETAILED DESCRIPTION

Figure 1:
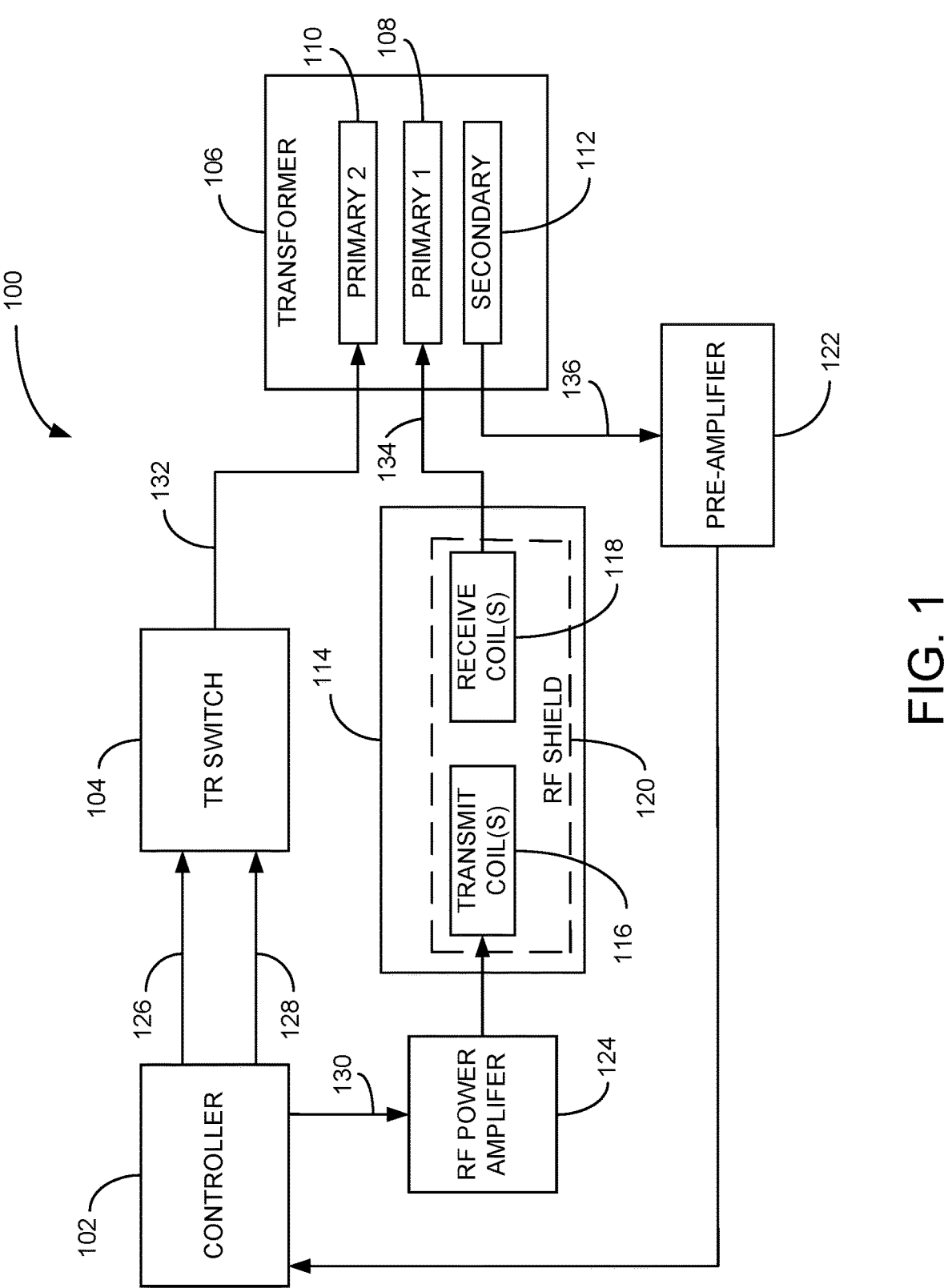
FIG. 1 is a schematic block diagram of a system for radio frequency (RF) based frequency encoding in accordance with an embodiment.

As mentioned, one strategy to eliminate conventional gradient systems is to replace them with specialized RF systems for RF gradient encoding. RF gradient encoding systems have numerous potential advantages over conventional ($B_0$) gradient systems such as making the MRI quiet, compact, and highly cost effective (e.g., by using commodity amplifiers that are readily available). In addition, RF gradient encoding does not have issues such as PNS and eddy currents associated to it. One such RF based gradient encoding method is to use specially designed RF coils that produce "gradient" fields by leveraging the Bloch Siegert (BS) shift. The Bloch Siegert shift states that by applying an RF pulse that is far off resonance, a phase shift also known as a gradient is formed which is proportional to the square of the $B_1^+$ field. Bloch-Siegert phase encoding and slice selection has previously been developed. However, to realize Block-Siegert frequency encoding requires the ability to simultaneously transmit and receive signals.

The present disclosure describes an apparatus, system and method for RF based frequency encoding that utilizes the Bloch-Siegert (BS) shift. The Bloch-Siegert shift can be used to achieve frequency encoding since the BS shift is applied while magnetization is in the transverse plane and does not lead to significant out-of-plane rotations, and, therefore, can generate detectable signal during spatial encoding. However, there is a need for both analog and digital filtering techniques to remove the interfering transmitted frequency encoding signal (also referred to herein as a leakage signal or an interference signal) from the received MR signal. In some embodiments, the disclosed system for RF based frequency encoding that utilizes the BS shift can be configured to enable simultaneous transmit and receive (STAR). In particular, in some embodiments, the system for RF based frequency encoding can include a simultaneous transmit and receive filter implemented using an injection transformer and configured to remove (or cancel) a portion of or substantially all of a leakage signal (i.e., the leaked signal from an RF based frequency encoding pulse played by the transmit coil that the imaging receive coil sees) from the MR data or signal received by the receive coil. In some embodiments, the disclosed system can include highly decoupled RF transmit coils (e.g., used to apply RF excitation/imaging pulses and RF based frequency encoding pulses) and receive coils (e.g., to detect MR signals/data). The disclosed system and apparatus for RF based frequency encoding can advantageously provide fully simultaneous transmission of a frequency encoding RF pulse during MR signal recording (or readout), and can be used to perform spatial frequency encoding using RF gradients in place of conventional $B_0$ gradients.

In some embodiments, a method for RF based frequency encoding using the disclosed system and apparatus can include performing a pulse sequence for RF based frequency encoding that includes an imaging module and a calibration module that are applied to acquire each predetermined portion of k-space (e.g., each phase encode line or radial spoke) and the pulse sequence can be configured to filter additional leakage signal digitally. In some embodiments, the disclosed systems and methods provided 99.75% cancellation of the RF based encoding signal and enabled the acquisition of frequency encoded MR images using RF gradients. Accordingly, as mentioned, the disclosed systems and methods for RF based frequency encoding can be used to replace conventional $B_0$ gradients. In some embodiments, the disclosed systems and methods for RF based frequency encoding advantageously enable the use of simple Fourier image reconstruction (e.g., using simple inverse Fast Fourier Transform (FFT) reconstruction) of the acquired MR data. In some embodiments, the disclosed systems and methods for RF based frequency encoding can be used in an MRI system for various MRI applications (e.g., MR spectroscopy, low field MRI, extremity MRI, brain MRI, etc.) and field strengths.

FIG. 1 is a schematic block diagram of a system for radio frequency (RF) based frequency encoding in accordance with an embodiment. The RF based frequency encoding system 100 includes a controller 104, a TR switch 104, a filter formed using an injection transformer 106, an RF encoding system 114, and a RF power amplifier 124. Controller 102 can be configured to generate various transmit signals 130, including, for example, excitation RF pulses for imaging and can be configured to receive MR signals or data (i.e., receive signals) generated in response to the transmitted signals 130. For example, as described further below, the MR signals 134 received from the subject by the receive coil 118 can be filtered using the filter 106, provided to the preamplifier 122 and then provided to the controller 102. In addition, for RF based frequency encoding using the Bloch Siegert (BS) shift, the transmit signals 130 generated by the controller 102 can also include RF frequency encoding pulses (or frequency encoding gradients). For RF based frequency encoding using the Bloch Siegert (BS) shift, the controller can also be configured to generate a cancellation signal 128 (discussed further below). The transmit signals 130 can be provided to an RF encoding system 114 through the RF power amplifier 124, and transmitted using one or more RF coils (e.g., transmit coil 116) in the RF encoding system 114. In some embodiments, a different transmit coil (or coils) 116 can be used to transmit the RF excitation pulses and to transmit the RF frequency encoding pulses. In some embodiments, the same transmit coil(s) 116 can be used to transmit both the RF excitation pulses and the RF frequency encoding pulses. MR signals or data 134 can be detected (or received) by one or more RF coils (e.g., receive coil 118) in the RF encoding system 114. In some embodiments, the transmit coil(s) 116 and the receive coil(s) 118 can be two or more decoupled ports of the same RF coil structure, for example, the I and Q (i.e., in phase and quadrature, respectively) ports of a birdcage coil. In some embodiments, the transmit coil(s) 116 and the receive coil(s) 118 can be positioned in an RF shield 120.

In some embodiments, the transmit coil(s) 116 may be a solenoid with a plurality of windings. For RF based frequency encoding using the BS shift, the transmit coil 116 can be designed to have a field shape that is spatially varying to have a spatially varying encoding effect. In one example, to apply a linear phase gradient across a subject, the transmit coil(s) can be configured to have a square-root $B_1^+$ field shape across the region of interest (ROI). Designing the transmit coil(s) 116 to have a square-root field shape can enable simple one-to-one mapping and Fourier inverse reconstruction for MR images acquired using the RF based frequency encoding using the BS shift, similar to conventional $B_0$ frequency encoding systems. In some embodiments, if the transmit coil 116 does not have a square-root $B_1^+$ field shape, more complex reconstruction techniques can be used to reconstruct images from acquired MR data. In some embodiments, the transmit coil(s) 116 can be configured to have high efficiency. In some embodiments, the transmit coil(s) 116 can be configured to include a plurality of bucking coils (or counter rotational loops) that can be positioned at one end of the solenoid of the transmit coil 116 for high efficiency, e.g., to achieve a true square root shape with high efficiency.

For RF based frequency encoding using the BS shift, the receive coil(s) 118 should be well-decoupled from the transmit coil(s) 116. In some embodiments, the receive coil(s) 118 and the RF encoding system 114 can be configured to provide maximum decoupling from the transmit coil(s) 116. In one example, the receive coil 118 may be implemented as a single loop/saddle receive coil that is orthogonal to the Bf field of the transmit coil 116 to enable geometric decoupling. In this example, the single loop receive coil can be positioned within the transmit coil 116 along the Y-direction of the magnet. In some embodiments, the receive coil 118 can be an insert receive coil. In some embodiments, the geometric decoupling can be used to achieve greater than 60 dB decoupling between the transmit coil 116 and the receive coil 118, which can provide high isolation between the transmit coil 116 and the receive coil 118. In some embodiments, the receive coil 118 can be implemented as a multi-turn saddle or multi-turn solenoid and other decoupling techniques such as, for example, capacitive, inductive, or pre-amp decupling, can be used. In some embodiments, for both single loop and multi-turn coils, one decoupling technique or a combination of decoupling techniques, for example, geometric and/or electrical (e.g., inductive or capacitive) decoupling techniques, can be used.

As mentioned above, frequency encoding gradients are applied (e.g., using transmit coil 116) at the same time the receive coil 118 is on for acquisition of MR signals or data from a subject (e.g., receiving MR signal or data during data acquisition or readout). Accordingly, RF based frequency encoding using the BS shift requires simultaneously transmitting the RF frequency encoding pulse(s) with the transmit coil 116 while recording (or receiving) the MR signal or data with the receive coil 118. As mentioned above, a leakage signal can be induced in the receive coil 118 from the RF based frequency encoding pulse transmitted by the transmit coil 116 and, therefore, the leakage signal can be included with MR signal or data received from the subject during image acquisition. If the transmit and receive frequencies are close to each other (e.g., <100 kHz or so), the transmitted RF based frequency encoding pulse can overwhelm the receiver. Accordingly, the system for RF based frequency encoding 100 includes a simultaneous transmit and receive filter 106 that can be configured to actively eliminate (or cancel) a portion of or substantially all of the leakage signal while preserving the MR signal (or data). In some embodiments, the simultaneous transmit and receive filter 106 can be implemented as an injection transformer that can include a first primary winding (or channel) 108, a second primary winding (or channel) 110 and a secondary winding (or channel) 112. The first primary winding can be coupled to and in signal communication with the receive coil 118 and is configured to receive the MR signal or data from the subject as detected by the receive coil 118. As mentioned, the MR signal 134 detected by the receive coil 118 can also include leakage signal induced by the RF based frequency encoding pulse played during data acquisition. The second primary winding 110 can be coupled to and in signal communication with the controller 102 and is configured to receive a cancellation signal 128 generated by the controller 102. The cancellation signal 128 produced by the controller 102 can have the same amplitude and opposite phase as that of the leakage signal. In some embodiments, a channel of the controller that produces the cancellation signal 128 can be isolated from the transformer of filter 106 using a TR switch 104 or bypass capacitors (not shown). In some embodiments, the active TR switch 104 can be configured to prevent any reflection of power into the controller 102. In some embodiments, as discussed further below, the cancellation signal 128 can be gated using a gating signal 126 generated by the controller 106. The first primary winding 108 (with the received MR signal and leakage signal) and the second primary winding 110 (with the cancellation signal) can induce a current (i.e., a filtered MR signal 136) in the secondary winding 112 that contains only the MR signal and, in some embodiments, some remaining leakage signal. The secondary winding 112 can be coupled to and in signal communication with a receive channel of the controller 102 through a low noise preamplifier 122. Operation of the injection transformer of the simultaneous transmit and receive filter 106 is discussed further below with respect FIG. 2.

Figure 2:
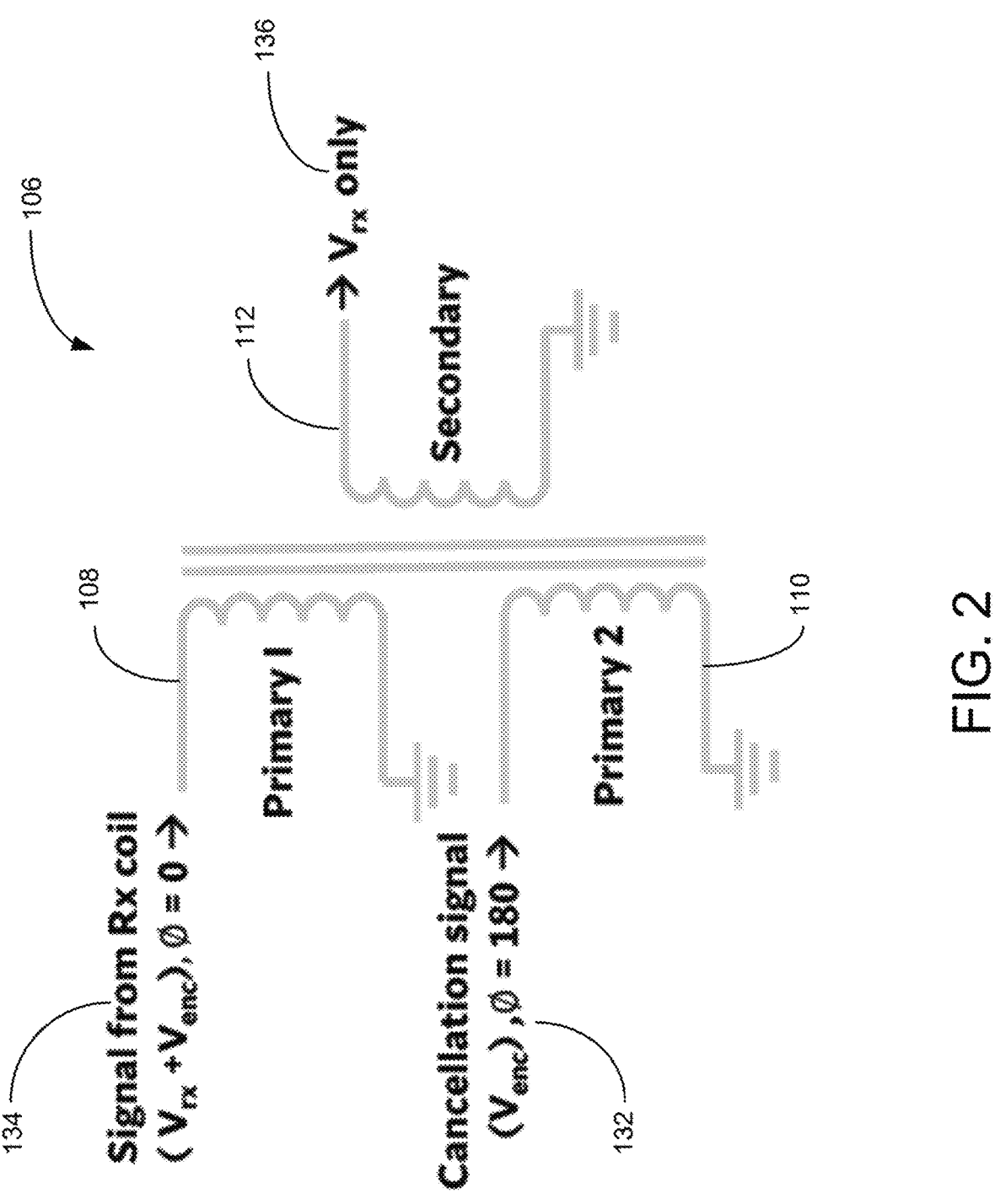
FIG. 2 is a circuit diagram of an injection transformer filter for simultaneous transmit and receive in accordance with an embodiment.

FIG. 2 is a circuit diagram of an injection transformer filter for simultaneous transmit and receive in accordance with an embodiment. As mentioned, the injection transformer filter 106 includes a first primary winding 108, a second primary winding 110 and a secondary winding 112 and can be configured to cancel the leakage signal induced in the receive coil 118 (shown in FIG. 1) by the RF based frequency encoding pulse. In some embodiments, the first primary winding 108, the second primary winding 110 and the secondary winding 112 can be constructed with three separate conductive wires that can be configured (e.g., twisted) to have a maximum mutual inductance between the three windings 108, 110, 112. The conductive wires can then be wound on a low core-loss toroid (or core). In some embodiments, the conductive wire can be Litz wire and a low core loss core can be a low-loss carbonyl iron core (i.e., constructed of a carbonyl iron power material). Litz wire can be used to provide low AC resistance and to reduce copper losses of the transformer 106. Using laminated or powdered core transformers can minimize core losses and eddy current losses, for example, by eliminating the formation of current loops, thereby minimizing eddy current losses.

The principle of operation of the injection transformer filter 106 is that when two primary windings 108, 110 are subjected to opposing phase and equal magnitude voltages, the secondary winding 112 will not experience any induced voltage. This occurs because the fluxes generated by the two primary windings 108, 110 cancel each other out. Accordingly, to eliminate the leakage signal while preserving the MR signal from the subject, the first primary winding 108 ($N_{P1}$) can be configured to receive a signal 134 from the receive coil 118 including the MR signal from the receive coil 118 combined with the leakage signal induced in the receive coil 118 from the RF frequency encoding pulse applied by the transmit coil 116 ($V_{rx}+V_{enc}$). The second primary winding 110 ($N_{P2}$) can be configured to receive a cancellation signal 132 having the same magnitude as the leakage signal but with opposite phase. The secondary winding 112 should then carry the MR signal (i.e., the filtered MR signal 136) without any presence of the leakage signal or a reduced amount of leakage signal.

Returning to FIG. 1, in some embodiments, the system for RF frequency encoding 100 achieved up to −70 dB cancellation using the transformer filter 106. In some embodiments, the simultaneous transmit and receive filter 106 with the injection transformer was able to achieve 99.75% leaked signal cancellation. The system for RF based frequency encoding 100 can be used in an MRI system (e.g., MRI system 600 shown in FIG. 7) for various MR applications including, for example, MR spectroscopy, low field MRI, extremity scanning, brain MRI, etc., and various field strengths.

Figure 3:
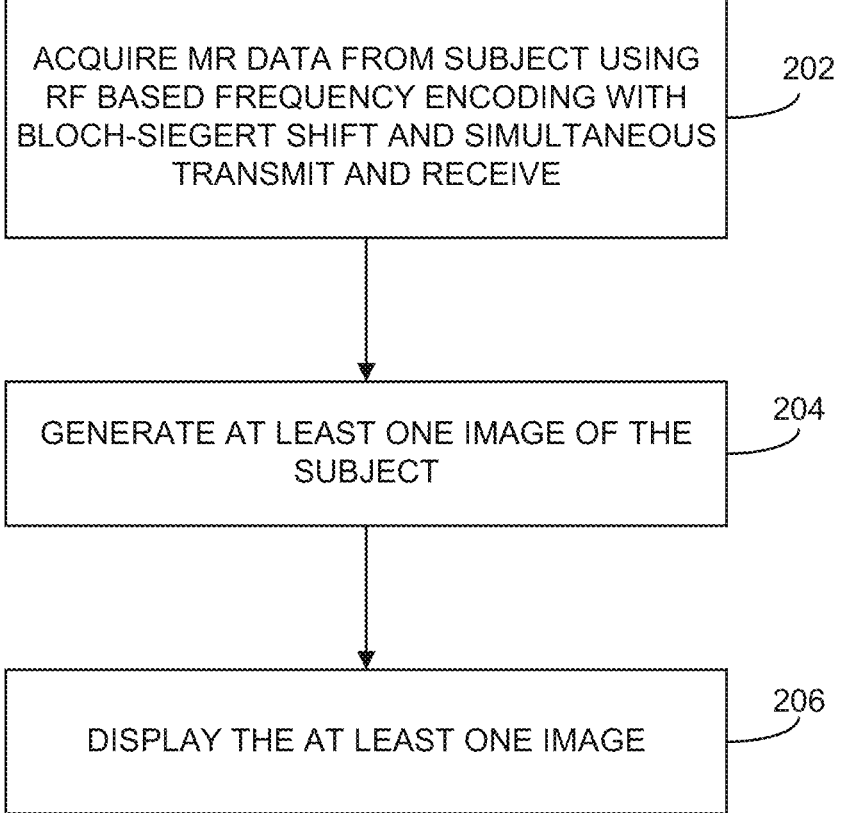
FIG. 3 illustrates a method for generating magnetic resonance (MR) images using RF based frequency encoding in accordance with an embodiment.

FIG. 3 illustrates a method for generating magnetic resonance (MR) images using RF based frequency encoding in accordance with an embodiment. The process illustrated in FIG. 3 is described as being carried out by the system illustrated in FIGS. 1 and 2. However, in some examples, the process of FIG. 3 may be implemented by another system. Although the blocks of the process of FIG. 3 are illustrated in a particular order, in some embodiments, one or more blocks may be executed in a different order than illustrated in FIG. 3, or may be bypassed.

At block 202, MR data (or signal) can be acquired from a subject using RF based frequency encoding with Bloch Siegert shift and simultaneous transmit and receive. As discussed above, a system for RF based frequency encoding 100 as described above with respect to FIGS. 1 and 2 can be used to provide frequency encoding gradients for the acquisition of the MR data. In particular, as mentioned, the system 100 advantageously includes a simultaneous transmit and receive filter 106 that can be configured to cancel or remove a portion of, substantially all, or all of a leakage signal (e.g., induced by RF frequency encoding pulses) from the MR signals detected by the receive coil 118. In some embodiments, the MR data may be acquired using a pulse sequence utilizing the RF based frequency encoding pulses (or gradients). In some embodiments, the pulse sequence may be configured for a two-dimensional (2D) or a three-dimensional (3-D acquisition. In some embodiments, the MR data can be acquired using a pulse sequence or acquisition that is configured to remove additional leakage signal from the MR signals detected by the receive coil 118, for example, a pulse sequence for RF based frequency encoding that includes an imaging module and a calibration module that are applied to acquire each predetermined position of k-space (e.g., each phase encode line or radial spoke) as described further below with respect to FIGS. 4 and 5.

At bock 204, an image or images may be generated using the acquired MR data from block 204. The image(s) may be generated using known reconstruction methods. As mentioned, in some embodiments, the disclosed RF based frequency encoding system and method can enable the use of simple Fourier image reconstruction (e.g., using simple inverse Fast Fourier Transform (FFT) reconstruction) of the acquired MR data. In some embodiments, more complex reconstruction methods may be used. At block 206, the generated image(s) may be displayed to a user on a display. for example, a display of an MRI system that includes the RF based frequency encoding system 100 (e.g., a display 604, 636 or 644 of MRI system 600 shown in FIG. 7). The image may also be stored in memory or data storage of, for example, an MRI system (e.g., the MRI system 600 of FIG. 7) or other computer system. In some embodiments, a repot may also be generated including, for example, the generated image. The report may include, for example, images or maps, text or metric based reports, audio reports and the like. The report may be provided to a display (e.g., display 604, 636 or 644 of MRI system 600 shown in FIG. 7). In some embodiments, the report may be stored in memory or data storage of, for example, an MRI system (e.g., MRI system 600 shown in FIG. 7) or other computer system.

Figure 4:
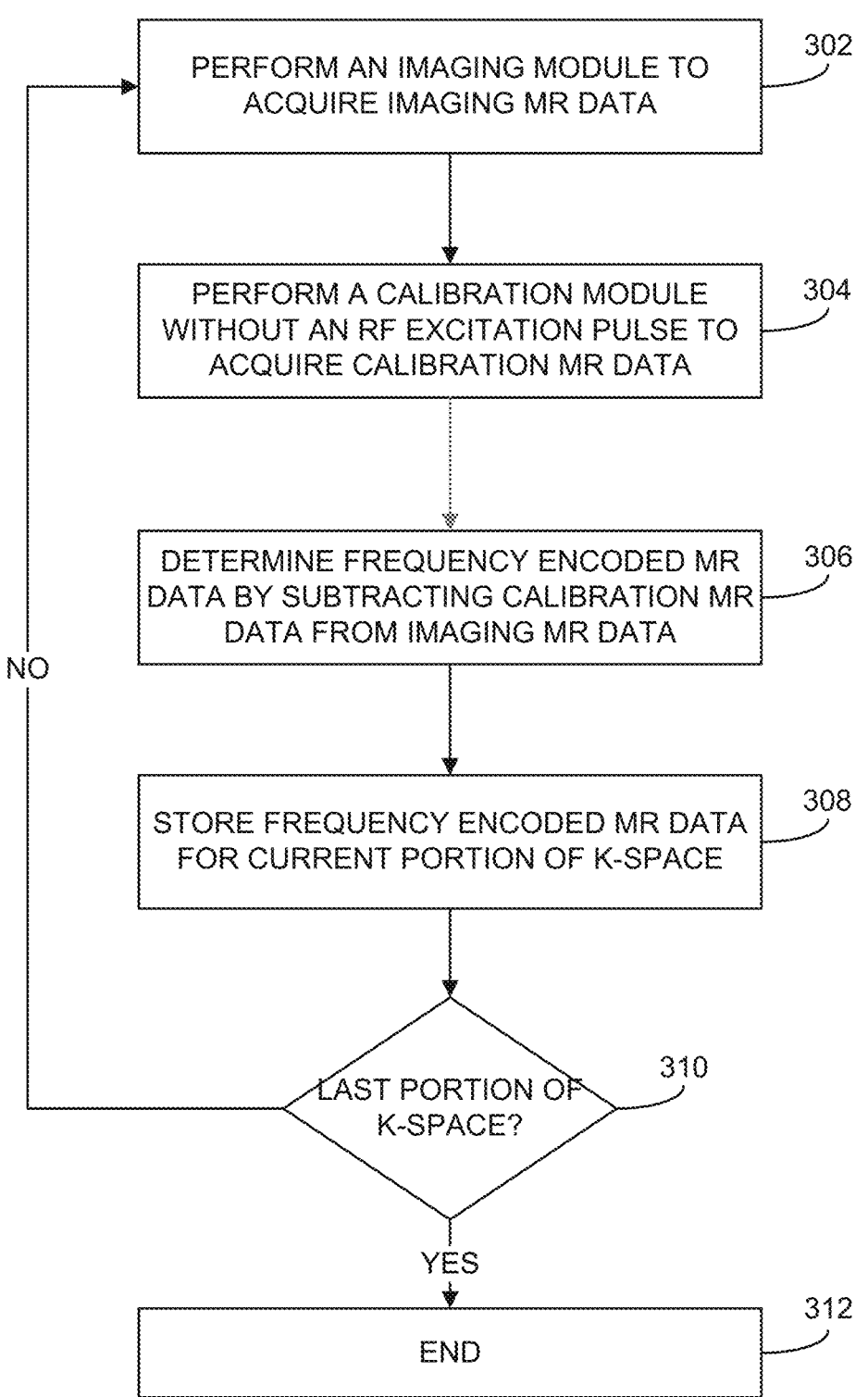
FIG. 4 illustrates a method for acquiring MR data using RF based frequency encoding in accordance with an embodiment.

As mentioned, RF frequency encoded MR data may be acquired from a subject using a pulse sequence or acquisition that is configured to remove additional leakage signal from the MR signals detected by the receive coil 118. FIG. 4 illustrates a method for acquiring magnetic resonance (MR) data using RF based frequency encoding in accordance with an embodiment. The process illustrates in FIG. 4 is described as being carried out by the system illustrated in FIGS. 1 and 2. However, in some examples, the process of FIG. 4 may be implemented by another system. Although the blocks of the process of FIG. 4 are illustrated in a particular order, in some embodiments, one or more blocks may be executed in a different order than illustrated in FIG. 4, or may be bypassed.

As mentioned above, in some embodiments, a pulse sequence for RF based frequency encoding can include an imaging module and a calibration module that are applied to acquire each predetermined portion of k-space. The predetermined portion of k-space can be based on the k-space sampling technique (e.g., Cartesian and non-Cartesian) utilized for the acquisition. For example, for Cartesian sampling, the combination of the imaging module and the calibration module can be applied to acquire each phase encode line. In another example, for radial sampling, the combination of the imaging module and the calibration module can be applied to acquire each radial spoke (or radial projection angle). At block 302, an imaging module of the RF based frequency encoding pulse sequence can be performed using an MRI system (e.g., MRI system 600 shown in FIG. 7) including the RF based frequency encoding system 100 to acquire imaging MR data or signal ($S_m$) for the current phase encode line. The imaging module can include an RF excitation pulse, a pre-phasor RF frequency encoding pulse applied before the readout, and a readout RF frequency encoding pulse applied during the readout. In some embodiments, the RF frequency encoding pulses (pre-phasor and readout) can be flat AM (amplitude modulated) and FM (frequency modulated) pulses. In some embodiments, the RF frequency encoding pulses (pre-phasor and readout) can be frequency swept pulses. The RF excitation pulse 206, RF frequency encoding pre-phasor pulse 408, 412, and the RF frequency encoding readout pulse 410, 414 can be applied using a transmit coil 116 of the RF based frequency encoding system 100. In some embodiments, a multi-dimensional frequency encoding scheme may be implemented. for example, the RF frequency encoding pulses may be time varying RF encoding pulses applied simultaneously in multiple transmit coils 116 (e.g., two or more transmit coils with different spatial variations). A multi-dimensional frequency encoding scheme can, for example, enable non-Cartesian sampling readouts, such as, for example radial or spiral.

At block 304, a calibration module of the RF based frequency encoding pulse sequence can be performed using the MRI system (e.g., MRI system 600 shown in FIG. 7) including the RF based frequency encoding system 100 to acquire a calibration MR data or signal ($S_c$) for the current phase encode line. In some embodiments, the calibration module includes the same pre-phasor RF frequency encoding pulse applied before the readout, and readout RF frequency encoding pulse applied during the readout as the imaging module. However, the calibration module does not include an RF excitation pulse. At block 306, frequency encoded MR data or signal ($S_{BS}$) can be determined by subtracting the calibration MR data, $S_c$, from the imaging MR data, $S_m$, as given by:

$$S_{BS} = S_m - S_c \qquad (1)$$

The calibration module can advantageously further filter the leakage signal digitally.

At block 308, the frequency encoded MR data, $S_{BS}$, for the current predetermined portion of k-space can be stored, for example, in memory or data storage of, for example, an MRI system (e.g., the MRI system 600 of FIG. 7) or other computer system. At block 310, it is determined whether there are any remaining predetermined portions of-k-space (e.g., phase encode lines or radial spokes) to be acquired (i.e., is the current predetermined portion of k-space the last one for the acquisition). If there are additional predetermined portions of k-space to be acquired, the process returns to block 302 and MR data (or signal) can be acquired for the next predetermined portion of k-space (e.g., the next phase encode line or radial spoke) using the process of blocks 302-308. If there are no more predetermined portions of k-space to be acquired, the process ends at block 312. The acquired imaging MR data for each predetermined portion of k-space e can be filtered with an injection transformer filter 106 as described above with respect to FIGS. 1 and 2, and the filtered imaging MR data for all of the acquired predetermined portions of k-space (e.g., phase encode lines or radial spokes) can be used to reconstruct or generate an image as described above with respect to FIG. 3.

Figure 5:
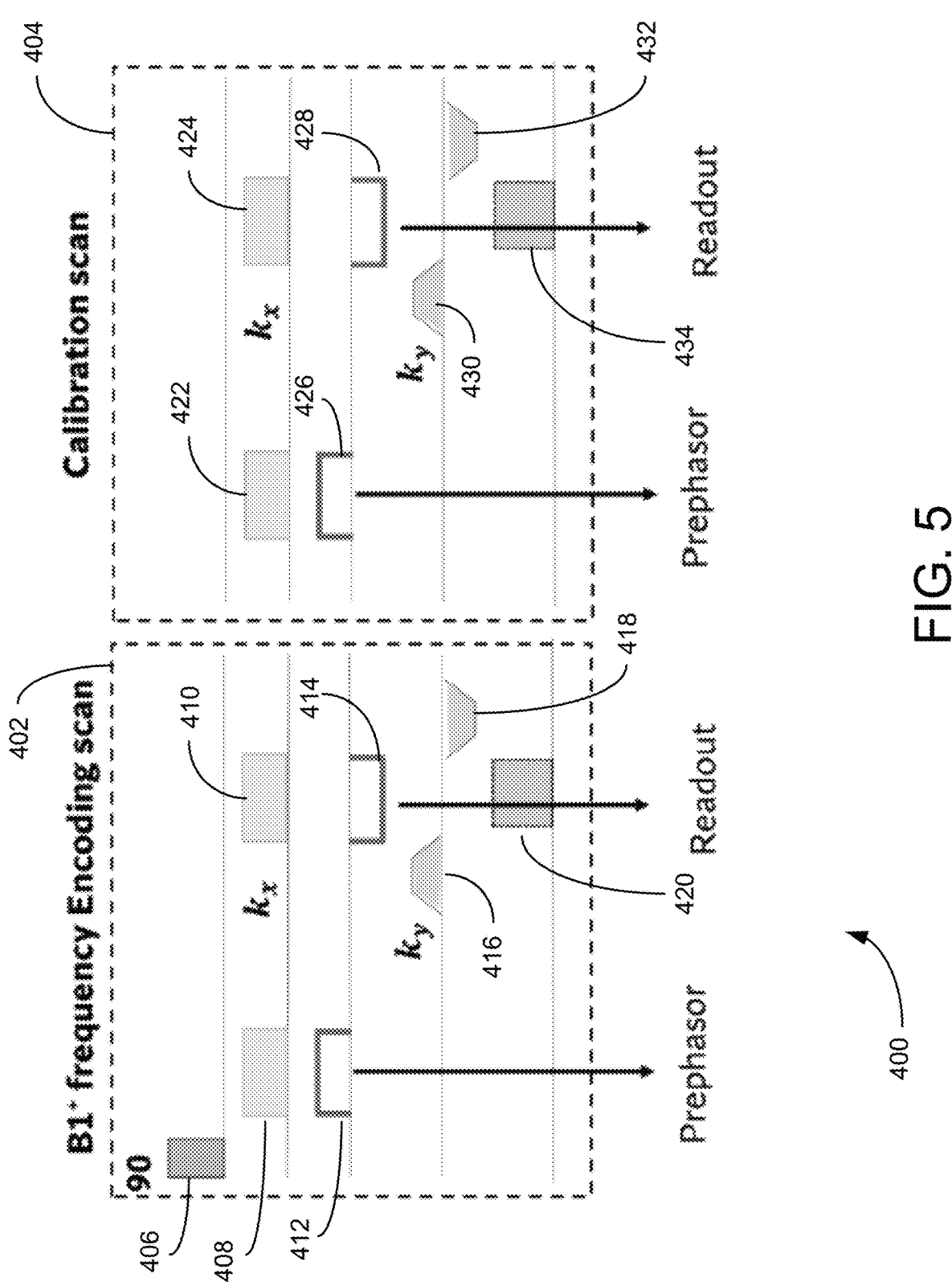
FIG. 5 is a pictorial representation of an example pulse sequence for RF based frequency encoding in accordance with an embodiment.

FIG. 5 is a pictorial representation of an example pulse sequence for RF based frequency encoding in accordance with an embodiment. The example pulse sequence illustrated in FIG. 5 is a two-dimensional (2D) GRE pulse sequence. While this example is a 2D GRE pulse sequence, it should be understood that the RF based frequency encoding method for acquiring MR data described with respect to FIG. 4 can be used with other types of pulses sequences including 2D and 3D pulse sequences. In FIG. 5, the RF frequency encoded pulse sequence 400 includes an imaging module 402 and a calibration module 404. The imaging module 402 includes an RF excitation pulse 406, an RF frequency encoded pulse 408, 412 (amplitude and frequency) used as a pre-phasor having a predetermined offset (e.g., 10 kHz), and a readout RF frequency encoded pulse 410, 414 (amplitude and frequency) having an offset of the opposite polarity as the pre-phaser (e.g., −10 kHz). The readout RF frequency encoded pulse 410, 414 is configured to achieve a GRE echo 420. In some embodiments, the pre-phasor RF frequency encoded pulse 408, 412 can be a frequency swept pulse or a flat AM and FM waveform pulse, and the readout RF frequency encoded pulse 410, 414 can be a flat AM and FM waveform pulse. The imaging sequence can also include appropriate other gradients, for example, phase encoding gradients 416, 418, or slice selection gradients (not shown) based on the type of sequence. In some embodiments, phase encoding and slice selection gradients can be applied using a conventional $B_0$ gradient system. In some embodiments, phase encoding and slice selection gradients can be applied using an RF encoding system (e.g., system 100 described above with respect to FIG. 1) using methods for BS based phase encoding and slice selection.

The calibration module 404 of the RF frequency encoded pulse sequence 400 is the same as the imaging module but does not include an RF excitation pulse. Accordingly, the calibration module 404 can include an RF frequency encoded pulse 422, 426 (amplitude and frequency) used as a pre-phasor having a predetermined offset (e.g., 10 kHz), and a readout RF frequency encoded pulse 424, 428 (amplitude and frequency) having an offset of the opposite polarity as the pre-phaser (e.g., −10 kHz). The readout RF frequency encoded pulse 424, 428 is configured to achieve a GRE echo 434. In some embodiments, the pre-phasor RF frequency encoded pulse 422, 426 can be a frequency swept pulse or a flat AM and FM waveform pulse, and the readout RF frequency encoded pulse 424, 428 can be a flat AM and FM waveform pulse. The calibration sequence can also include appropriate other gradients, for example, phase encoding gradients 430, 432, or slice selection gradients (not shown) based on the type of sequence. In some embodiments, phase encoding and slice selection gradients can be applied using a conventional $B_0$ gradient system. In some embodiments, phase encoding and slice selection gradients can be applied using an RF encoding system (e.g., system 100 described above with respect to FIG. 1) using methods for BS based phase encoding and slice selection. As mentioned above, the imaging module 402 and the calibration module 404 can be applied for each predetermined portion of k-space (e.g., a phase encode line or radial spoke) and the calibration signal acquired with calibration module 404 can be subtracted from the imaging signal acquired with the imaging module 402 to obtain a frequency encoded signal (or MR data) for each predetermined portion of k-space. FIG. 5 illustrates one TR (repetition time) and interleaving signal measurements (e.g., imaging module 402) with calibration measurements (e.g., calibration module 404) in each TR enables the subtraction of residual leakage (or interfering) signal.

Returning to FIG. 1, an ideal transformer for the simultaneous transmit and receive filter 106 used for active leakage signal cancellation would use a cancellation signal 128 whose magnitude matched that of the leakage (or interference) signal exactly and is 180° phase shifted for cancellation. However, in real world settings, this is not the case because transformers are rarely or never 100% efficient. Therefore, in some embodiments, the magnitude and phase of the cancellation signal 128 can be calibrated (or adjusted) prior to imaging so as to match the leakage signal as closely as possible to, for example, achieve maximum cancellation of the leaked signal. FIG. 6 illustrates a method for calibrating a cancellation signal for RF based frequency encoding in accordance with an embodiment. The process illustrates in FIG. 6 is described as being carried out by the system illustrated in FIGS. 1 and 2. However, in some examples, the process of FIG. 6 may be implemented by another system. Although the blocks of the process of FIG. 6 are illustrated in a particular order, in some embodiments, one or more blocks may be executed in a different order than illustrated in FIG. 6, or may be bypassed.

At block 502, an RF frequency encoding pulse (or interference pulse) can be applied by itself using power amplifier 124 and transmit coil 116 to acquire an interference signal (S$_i$). The interference pulse can have an off resonance frequency and an appropriate amplitude to achieve the desired frequency encoding with a flat FM and AM waveform during the acquisition (or readout) time, and can have an acquisition bandwidth that is larger than the off-resonance frequency used. In some embodiments, the interference pulse can be played for an additional predetermined time before and after the acquisition or readout to avoid any transients in the leakage signal for cancellation. The interference signal generated in response to the interference pulse can be received through the receive coil 118 and the first primary winding 108 of the transformer filter 106. A cancellation signal 128 is not applied. The interference signal can then be provided from the transformer filter 106 (e.g., secondary winding 112) to the controller 102 without the preamplifier 122 (e.g., the preamplifier can be disconnected).

At block 504, a cancellation signal with the same duration, shape, amplitude and phase as the interference pulse can be applied by itself to obtain a cancellation signal (S$_c$) from the output of the transformer. A RF frequency encoding pulse (or interference pulse) is not applied. The cancellation signal (or pulse) can be generated by the controller 102 and applied through the TR switch 104 with appropriate gating, and the second primary winding 110 of the transformer filter 106. The cancellation signal S$_c$ can be provided from the transformer (e.g., secondary winding 112) to the controller 102 without the preamplifier 122 (e.g., the preamplifier can be disconnected)

At block 506, the interference signal, S$_i$, and the cancellation signal, S$_c$, can be fit to each other to obtain an amplitude and phase scaling factor. For example, in some embodiments, the interference signal and the cancellation signal can be linearly fit to obtain the amplitude and phase scaling factor. In some embodiments, the amplitude and phase scaling factor is a complex valued scaling factor. At block 508, the amplitude and phase scaling factor can be applied to the cancellation signal used in block 504 to obtain a scaled cancellation signal. In some embodiments, the phase of the scaling factor can be shifted by 180° to achieve full cancellation. At block 510, the scaled cancellation signal (or pulse) can be stored, for example, in memory or data storage of, for example, an MRI system (e.g., the MRI system 600 of FIG. 7) or other computer system. the scaled calibration pulse can then be used for an MR acquisition using the RF based frequency encoding. In some embodiments, the interference pulse and the scaled cancellation signal can be played together using the system 100 without the preamplifier 122 to validate the scaling factor determined at block 506. In some embodiments, the scaled cancellation signal can be used for an imaging scan along with the inference pulse that can be used as the RF frequency encoding pulse for the acquisition of MR data.

At block 512, additional fine tuning of the amplitude and phase of the cancellation signal can optionally be performed iteratively, for example, to achieve maximum cancellation (e.g., the filtered signal output by the secondary winding when playing both the interference signal and the current cancellation signal is as low as possible). In some embodiments, the process blocks 502-510 can be repeated starting with the current scaled cancellation signal. At block 514, the updated cancellation signal (or pulse) determined using the additional fine tuning can be stored, for example, in memory or data storage of, for example, an MRI system (e.g., the MRI system 600 of FIG. 7) or other computer system. In some embodiments, after fine tuning calibration of the cancellation signal, the preamplifier can be connected back into the system 100 and the interference pulse and calibrated cancellation signal can be plated together. Further fine tuning calibration of the amplitude and phase of the cancellation signal can then be performed iteratively to account for potential phase shift introduced by the preamplifier.

In some embodiments, calibration of the shape of the interference pulse (e.g., the RF frequency encoding pulse) may also be performed before imaging. Since the interference signal S$_i$ (i.e., signal generated from an RF frequency encoding or interference pulse) goes through several stages before reaching the receiver channel in the controller 102, the amplitude of the interference signal. S$_i$, may be modulated in particular due to the different Q's (Quality Factors) of the transmit 116 and receive 118 coils. Due to this modulation, maximum cancellation will not be achieved since, in some embodiments, the cancellation signal has a flat AM waveform. To compensate for this, in some embodiments, the interference pulse (or RF frequency encoding pulse) can be pre-emphasized so that the protons experience a flat waveform, which can also improve the cancellation of the leaked signal because the cancellation signal was not pre-emphasized. In some embodiments, the RF frequency encoding pulse (or interference pulse) can be pre-emphasized by using the mirror waveforms of the acquired interference signal S$_i$.

In some embodiments, the shape of the leakage signal induced in the receive coil 118 by the RF frequency encoding pulse can be matched to the shape of the cancellation signal 128. First, the preamplifier 122 may be disconnected and an RF frequency encoding pulse (or interference pulse) can be applied using the power amplifier 124 and transmit coil 116 without any cancellation pulse. An interference signal can then be detected by the receive coil 118 and provided to the first primary winding 108 of the transformer filter 106. The interference signal can then be provided from the secondary winding 112 to the controller 102. The received interference signal can then be scaled to the maximum amplitude of the interference pulse (or RF frequency encoding pulse). the scaled interference signal can then be subtracted from a flat pulse to produce a shaped pulse that is opposite the scaled interference signal. The shaped pulse can then be used as the RF frequency encoding pulse for imaging to produce as flat a pulse as possible that matched the cancellation signal from the controller 102.

In some embodiments, the desired amplitude for a readout RF frequency encoding gradient pulse can be determined by repeating the steps of the method described in FIG. 6 for varying RF frequency encoding pulse amplitudes and determining which amplitude produces a desired resolution. In some embodiments, the length of a pre-phasor RF frequency encoding gradient pulse can be tunes by repeating the steps of the method described in FIG. 6 for different pre-phasor gradient lengths and fixed readout lengths and amplitude to determine which length can produce the echo in the center of the readout acquisition window in the time domain.

Figure 7:
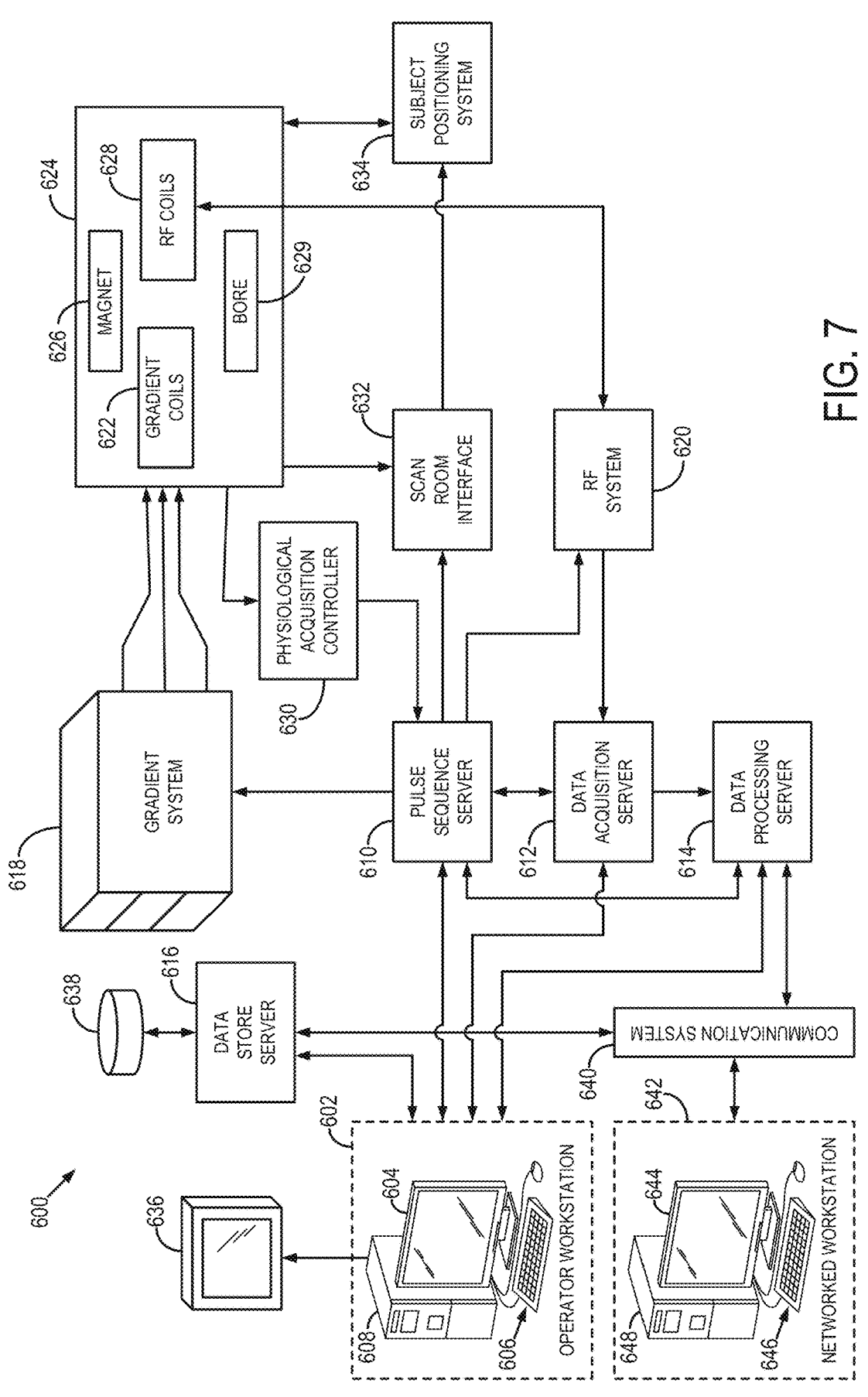
FIG. 7 is schematic diagram of an example magnetic resonance imaging (MRI) system in accordance with an embodiment.

FIG. 7 shows an example of an MRI system 600 in accordance with an embodiment. The disclosed system and methods for RF based frequency encoding may be implemented using or designed to accompany a magnetic resonance imaging ("MRI") system 100, such as is illustrated in FIG. 7. MRI system 600 includes an operator workstation 602, which may include a display 604, one or more input devices 606 (e.g., a keyboard, a mouse), and a processor 608. The processor 608 may include a commercially available programmable machine running a commercially available operating system. The operator workstation 602 provides an operator interface that facilitates entering scan parameters into the MRI system 600. The operator workstation 602 may be coupled to different servers, including, for example, a pulse sequence server 610, a data acquisition server 612, a data processing server 614, and a data store server 616. The operator workstation 602 and the servers 610, 612, 614, and 616 may be connected via a communication system 640, which may include wired or wireless network connections.

The pulse sequence server 610 functions in response to instructions provided by the operator workstation 602 to operate a conventional gradient system 618 and a radiofrequency ("RF") system 620. Gradient waveforms for performing a prescribed scan are produced and applied to the gradient system 618, which then excites gradient coils in an assembly 622 to produce the magnetic field gradients $G_x$, $G_y$, and $G_z$ that are used for spatially encoding magnetic resonance signals. The gradient coil assembly 622 forms part of a magnet assembly 624 that includes a polarizing magnet 626, a RF coil(s) 628 (e.g., a whole-body RF coil and/or local coils), and a bore 629 for a subject (e.g., a patient or object). While FIG. 6 illustrates a conventional gradient system, it should be understood that in some embodiments, the MRI system 600 can also include a system for RF based frequency encoding as described above with respect to FIGS. 1-6 and, in some embodiments, may only include a system for RF frequency encoding and not a conventional gradient system. Accordingly, the RF system 120 and RF coil(s) 128 may be configured to implement the system and methods for RF frequency encoding described above with respect to FIGS. 1-6.

RF waveforms are applied by the RF system 620 to the RF coil(s) 628, or a separate local coil to perform the prescribed magnetic resonance pulse sequence including, in some embodiments, RF based frequency encoding using the systems and methods described above with respect to FIGS. 1-6. Responsive magnetic resonance signals detected by the RF coil(s) 128, or a separate local coil, are received by the RF system 620. The responsive magnetic resonance signals may be amplified, demodulated, filtered, and digitized under direction of commands produced by the pulse sequence server 610. The RF system 620 includes an RF transmitter for producing a wide variety of RF pulses used in MRI pulse sequences including, in some embodiments, RF excitation pulses and RF based frequency encoding pulses. The RF transmitter is responsive to the prescribed scan and direction from the pulse sequence server 610 to produce RF pulses of the desired frequency, phase, and pulse amplitude waveform. The generated RF pulses may be applied to the RF coil(s) 128 (e.g., a whole body RF coil or to one or more local coils or coil arrays).

The RF system 620 also includes one or more RF receiver channels. An RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2}\,;\tag{2}$$

and the phase of the received magnetic resonance signal may also be determined according to the following relationship:

$$\varphi = \tan^{-1}\left(\frac{Q}{I}\right).\tag{3}$$

The pulse sequence server 610 may receive patient data from a physiological acquisition controller 630. By way of example, the physiological acquisition controller 630 may receive signals from a number of different sensors connected to the patient, including electrocardiograph ("ECG") signals from electrodes, or respiratory signals from a respiratory bellows or other respiratory monitoring devices. These signals may be used by the pulse sequence server 610 to synchronize, or "gate," the performance of the scan with the subject's heartbeat or respiration.

The pulse sequence server 610 may also connect to a scan room interface circuit 632 that receives signals from various sensors associated with the condition of the patient and the magnet system. Through the scan room interface circuit 632, a patient positioning system 634 can receive commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, so that data is not lost by data overrun. In some scans, the data acquisition server 612 passes the acquired magnetic resonance data to the data processor server 614. In scans that require information derived from acquired magnetic resonance data to control the further performance of the scan, the data acquisition server 612 may be programmed to produce such information and convey it to the pulse sequence server 610. For example, during pre-scans, magnetic resonance data may be acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also process magnetic resonance signals used to detect the arrival of a contrast agent in a magnetic resonance angiography ("MRA") scan. For example, the data acquisition server 612 may acquire magnetic resonance data and processes it in real-time to produce information that is used to control the scan.

The data processing server 614 receives magnetic resonance data from the data acquisition server 612 and processes the magnetic resonance data in accordance with instructions provided by the operator workstation 602. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 614 are conveyed back to the operator workstation 602 for storage. Real-time images may be stored in a data base memory cache, from which they may be output to operator display 602 or a display 636. Batch mode images or selected real time images may be stored in a host database on disc storage 638. When such images have been reconstructed and transferred to storage, the data processing server 614 may notify the data store server 616 on the operator workstation 602. The operator workstation 602 may be used by an operator to archive the images, produce films, or send the images via a network to other facilities.

The MRI system 600 may also include one or more networked workstations 642. For example, a networked workstation 642 may include a display 644, one or more input devices 646 (e.g., a keyboard, a mouse), and a processor 648. The networked workstation 642 may be located within the same facility as the operator workstation 602, or in a different facility, such as a different healthcare institution or clinic.

The networked workstation 642 may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may be exchanged between the data processing server 614 or the data store server 616 and the networked workstations 642, such that the data or images may be remotely processed by a networked workstation 642.

Computer-executable instructions for RF based frequency encoding with Bloch-Siegert shift and simultaneous transmit and receive according to the above-described methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly stated, are possible and within the scope of the invention.

The invention claimed is:

1. A system for RF based frequency encoding utilizing a Bloch-Siegert shift, the system comprising:
   a controller configured to generate RF excitation pulses, RF based frequency encoding pulses and a cancellation signal;
   an RF encoding system in signal communication with the controller and comprising one or more RF coils configured to transmit the RF excitation pulses and RF based frequency encoding pulses, and to receive an MR signal from the subject wherein the MR signal includes a leakage signal induced by the RF based frequency encoding pulses; and
   an injection transformer simultaneous transmit and receive filter in signal communication with the controller and the RF encoding system, the injection transformer simultaneous transmit receive filter configured to receive the cancellation signal, the MR signal including the leakage signal, and to cancel the leakage signal from the received MR signal to generate a filtered MR signal.

2. A method for generating an image of a subject using RF based frequency encoding utilizing a Bloch-Siegert shift, the method comprising:
   for each of a plurality of predetermined portions of k-space:
      performing an imaging module of a RF based frequency encoding pulse sequence to obtain imaging MR data, the imaging module comprising an RF excitation pulse and one or more RF frequency encoding pulses;
      performing a calibration module of the RF based frequency encoding pulse sequence to obtain calibration MR data, the calibration module performed without the RF excitation pulse and comprising the one or more RF frequency encoding pulses; and
      determining frequency encoded MR data by subtracting the calibration MR data from the imaging MR data;
   storing the determined frequency encoded MR data for each predetermined portion of k-space; and
   generating an image of the subject based on the frequency encoded MR data for the plurality of predetermined portions of k-space.

3. The system according to claim 1, wherein an amplitude of the cancellation signal is the same as an amplitude of the leakage signal and a phase of the cancellation signal is the opposite of a phase of the leakage signal, and wherein the injection transformer simultaneous transmit receive filter comprises:
   a first primary winding configured to receive the MR signal including the leakage signal from the RF encoding system;
   a second primary winding configured to receive the cancellation signal from the controller; and
   a secondary winding wherein the MR signal without the leakage signal is induced in the secondary winding.

4. The system according to claim 1, further comprising a TR switch coupled between the controller and the injection transformer simultaneous transmit and receive filter.

5. The system according to claim 1, further comprising a pre-amplifier coupled between the injection transformer simultaneous transmit and receive filter and the controller.

6. The system according to claim 1, further comprising a power amplifier coupled between the controller and the RF encoding system.

7. The system according to claim 1, wherein the RF encoding system further comprises an RF shield.

8. The system according to claim 1, wherein an amplitude and a phase of the cancellation signal is calibrated to produce a maximum cancellation of the leakage signal.

9. The system according to claim 1, wherein a shape of the RF based frequency encoding pulses is calibrated to match a shape of the cancellation signal.

10. The system according to claim 1, wherein the one or more RF coils of the RF encoding system comprises a transmit coil and a receive coil and the transmit coil and the receive coil are decoupled.

11. The system according to claim 1, wherein the one or more RF coils of the RF encoding system comprising an RF coil including a transmit port and a receive port, and the transmit port and the receive port are decoupled.

12. The system according to claim 1, wherein the receive coil is a single loop coil.

13. The system according to claim 1, wherein the RF based frequency encoding pulses are flat amplitude modulated (AM) and frequency modulated (FM) waveforms.

14. The method according to claim 2, wherein the one or more RF frequency encoding pulses comprises a pre-phasor RF frequency encoding pulse and a readout RF frequency encoding pulse.

15. The method according to claim 2, wherein the RF based frequency encoding pulses are flat amplitude modulated (AM) and frequency modulated (FM) waveforms.

16. The method according to claim 2, wherein the RF based frequency encoding pulses are time-varying.

17. The system according to claim 2, wherein the first primary winding, the second primary winding and the secondary winding are formed using Litz wire and a low-loss core.

18. The system according to claim 10, wherein the transmit coil and the receive coil are decoupled using one or more of geometric decoupling or electrical decoupling.

19. The system according to claim 10, wherein the transmit coil comprises a plurality of bucking coils positioned on an end of the transmit coil.

* * * * *